US011500613B2

(12) United States Patent
Chang et al.

(10) Patent No.: US 11,500,613 B2
(45) Date of Patent: Nov. 15, 2022

(54) MEMORY UNIT WITH MULTIPLY-ACCUMULATE ASSIST SCHEME FOR MULTI-BIT CONVOLUTIONAL NEURAL NETWORK BASED COMPUTING-IN-MEMORY APPLICATIONS AND COMPUTING METHOD THEREOF

(71) Applicant: NATIONAL TSING HUA UNIVERSITY, Hsinchu (TW)

(72) Inventors: Meng-Fan Chang, Hsinchu (TW); Han-Wen Hu, Tainan (TW); Kuang-Tang Chang, Nantou County (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 400 days.

(21) Appl. No.: 16/784,215

(22) Filed: Feb. 6, 2020

(65) Prior Publication Data

US 2021/0247962 A1    Aug. 12, 2021

(51) Int. Cl.
*G06F 7/544*    (2006.01)
*G11C 13/00*    (2006.01)
*G06N 3/08*    (2006.01)

(52) U.S. Cl.
CPC ............. *G06F 7/5443* (2013.01); *G06N 3/08* (2013.01); *G11C 13/0026* (2013.01); *G11C 13/0028* (2013.01); *G11C 13/0038* (2013.01); *G11C 13/004* (2013.01); *G11C 13/0061* (2013.01)

(58) Field of Classification Search
CPC ......... G06F 7/5443; G06F 17/16; G06G 7/16; G06N 3/0635
See application file for complete search history.

(56) References Cited

U.S. PATENT DOCUMENTS

| 2015/0131383 A1* | 5/2015 | Akerib ................. G11C 13/004 |
| | | 365/189.011 |
| 2016/0063284 A1* | 3/2016 | Tiwari ..................... G06G 7/16 |
| | | 708/620 |
| 2020/0026995 A1* | 1/2020 | Buchanan ............ G06N 3/0635 |
| 2020/0365209 A1* | 11/2020 | Lin ........................ G06F 7/5443 |
| 2020/0411066 A1* | 12/2020 | Choi .................... G11C 11/1659 |
| 2021/0005230 A1* | 1/2021 | Wang .................... G11C 7/1006 |
| 2021/0073621 A1* | 3/2021 | Seo ......................... G06F 7/523 |

* cited by examiner

*Primary Examiner* — Emily E Larocque
*Assistant Examiner* — Carlo Waje
(74) *Attorney, Agent, or Firm* — CKC & Partners Co., LLC

(57) ABSTRACT

A memory unit with a multiply-accumulate assist scheme for a plurality of multi-bit convolutional neural network based computing-in-memory applications is controlled by a reference voltage, a word line and a multi-bit input voltage. The memory unit includes a non-volatile memory cell, a voltage divider and a voltage keeper. The non-volatile memory cell is controlled by the word line and stores a weight. The voltage divider includes a data line and generates a charge current on the data line according to the reference voltage, and a voltage level of the data line is generated by the non-volatile memory cell and the charge current. The voltage keeper generates an output current on an output node according to the multi-bit input voltage and the voltage level of the data line, and the output current is corresponding to the multi-bit input voltage multiplied by the weight.

20 Claims, 15 Drawing Sheets

MEMORY UNIT WITH MULTIPLY-ACCUMULATE ASSIST SCHEME FOR MULTI-BIT CONVOLUTIONAL NEURAL NETWORK BASED COMPUTING-IN-MEMORY APPLICATIONS AND COMPUTING METHOD THEREOF

BACKGROUND

Technical Field

The present disclosure relates to a memory unit and a computing method thereof. More particularly, the present disclosure relates to a memory unit with a multiply-accumulate assist scheme for a plurality of multi-bit convolutional neural network based computing-in-memory applications and a computing method thereof.

Description of Related Art

In these years, due to the industrial growth of mobile device, medical electrical equipment, portable storage, etc., requirement of memory with low power, high speed and high density is increased. Computation-in-Memory (CIM) is a promising solution to improve the energy efficiency of multiply-accumulate (MAC) operations for AI chips, and multiple-bit convolutional neural network (CNN) is required for high inference accuracy in many applications.

However, a state-of-art non-volatile memory (NVM) for CIM has some challenges and issues as follows: (1) A process variation on the NVM cell, (2) A leakage current of a high resistance state (HRS) cell, and (3) a large DC current. Therefore, a memory unit with a multiply-accumulate assist scheme for a plurality of multi-bit convolutional neural network based computing-in-memory applications and a computing method thereof having the features of calibrating the variation of the NVM cell within MAC operations and eliminating the leakage current of the HRS cell and the large DC current are commercially desirable.

SUMMARY

According to one aspect of the present disclosure, a memory unit with a multiply-accumulate (MAC) assist scheme for a plurality of multi-bit convolutional neural network (CNN) based computing-in-memory (CIM) applications is controlled by a reference voltage, a word line and a multi-bit input voltage. The memory unit with the MAC assist scheme for the multi-bit CNN based CIM applications includes a non-volatile memory cell, a voltage divider and a voltage keeper. The non-volatile memory cell is controlled by the word line and stores a weight. The voltage divider is connected to the non-volatile memory cell and controlled by the reference voltage. The voltage divider includes a data line and generates a charge current on the data line according to the reference voltage, and a voltage level of the data line is generated by the non-volatile memory cell and the charge current. The voltage keeper is connected to the voltage divider via the data line and receives the multi-bit input voltage and the voltage level of the data line. The voltage keeper generates an output current on an output node according to the multi-bit input voltage and the voltage level of the data line, and the output current is corresponding to the multi-bit input voltage multiplied by the weight.

According to another aspect of the present disclosure, a computing method of the memory unit with the MAC assist scheme for the multi-bit CNN based CIM applications includes a voltage level applying step and a computing step. The voltage level applying step includes applying a plurality of voltage levels to the reference voltage, the word line and the multi-bit input voltage, respectively. The computing step includes driving the voltage divider to generate the charge current on the data line according to the reference voltage and generate the voltage level of the data line by the non-volatile memory cell and the charge current, and driving the voltage keeper to generate the output current on the output node according to the multi-bit input voltage and the voltage level of the data line.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiment will be described with the drawings. For clarity, some practical details will be described below. However, it should be noted that the present disclosure should not be limited by the practical details, that is, in some embodiment, the practical details is unnecessary. In addition, for simplifying the drawings, some conventional structures and elements will be simply illustrated, and repeated elements may be represented by the same labels.

It will be understood that when an element (or device) is referred to as be "connected to" another element, it can be directly connected to the other element, or it can be indirectly connected to the other element, that is, intervening elements may be present. In contrast, when an element is referred to as be "directly connected to" another element, there are no intervening elements present. In addition, the terms first, second, third, etc. are used herein to describe various elements or components, these elements or components should not be limited by these terms. Consequently, a first element or component discussed below could be termed a second element or component.

Before describing any embodiments in detail, some terms used in the following are described. A voltage level of "1" represents that the voltage is equal to a power supply voltage VDD. The voltage level of "0" represents that the voltage is equal to a ground voltage VSS. A PMOS transistor and an NMOS transistor represent a P-type MOS transistor and an N-type MOS transistor, respectively. Each transistor has a source, a drain and a gate.

Figure 1:
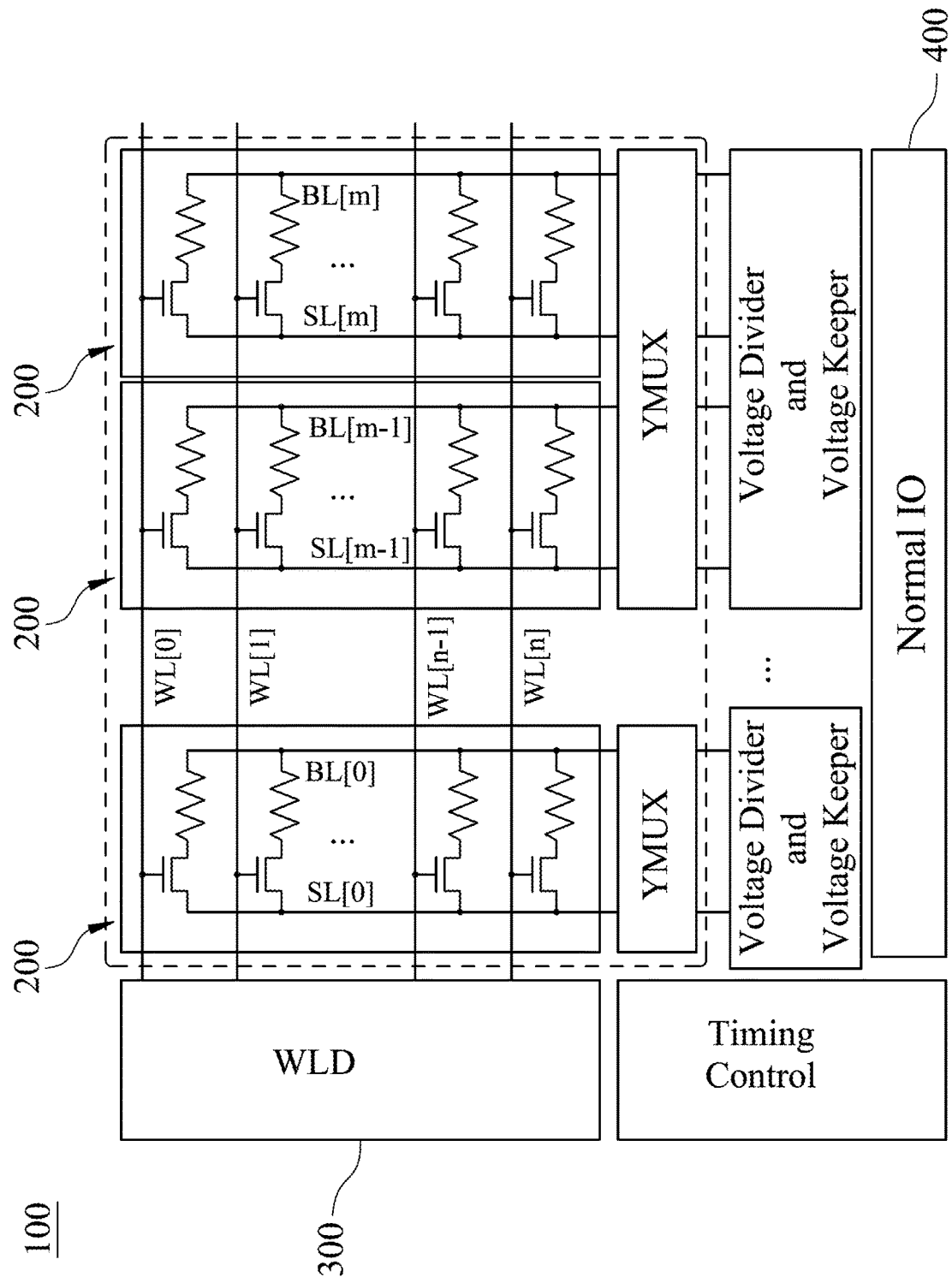
FIG. 1 shows a block diagram of a memory array structure with a multiply-accumulate assist scheme for a plurality of multi-bit convolutional neural network based computing-in-memory applications according to a first embodiment of the present disclosure.
Figure 2:
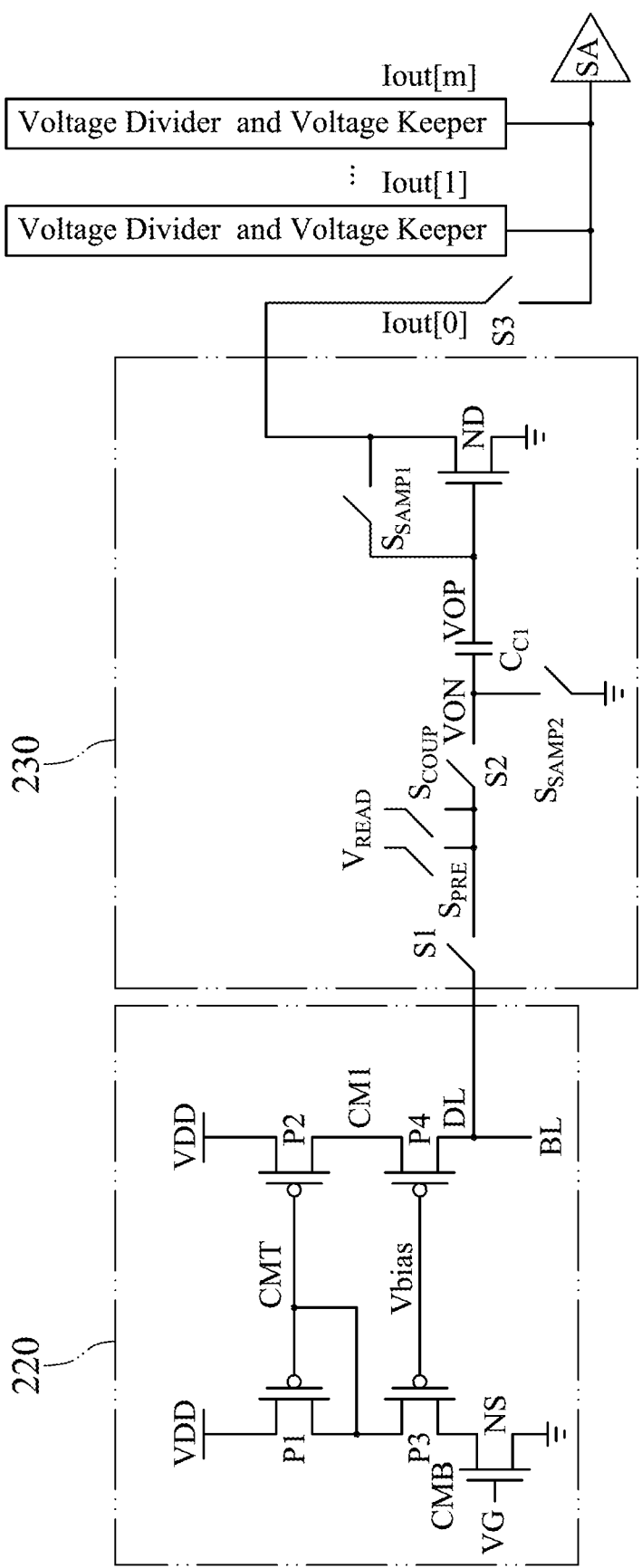
FIG. 2 shows a circuit diagram of a plurality of memory units of the memory array structure of FIG. 1.
Figure 3:
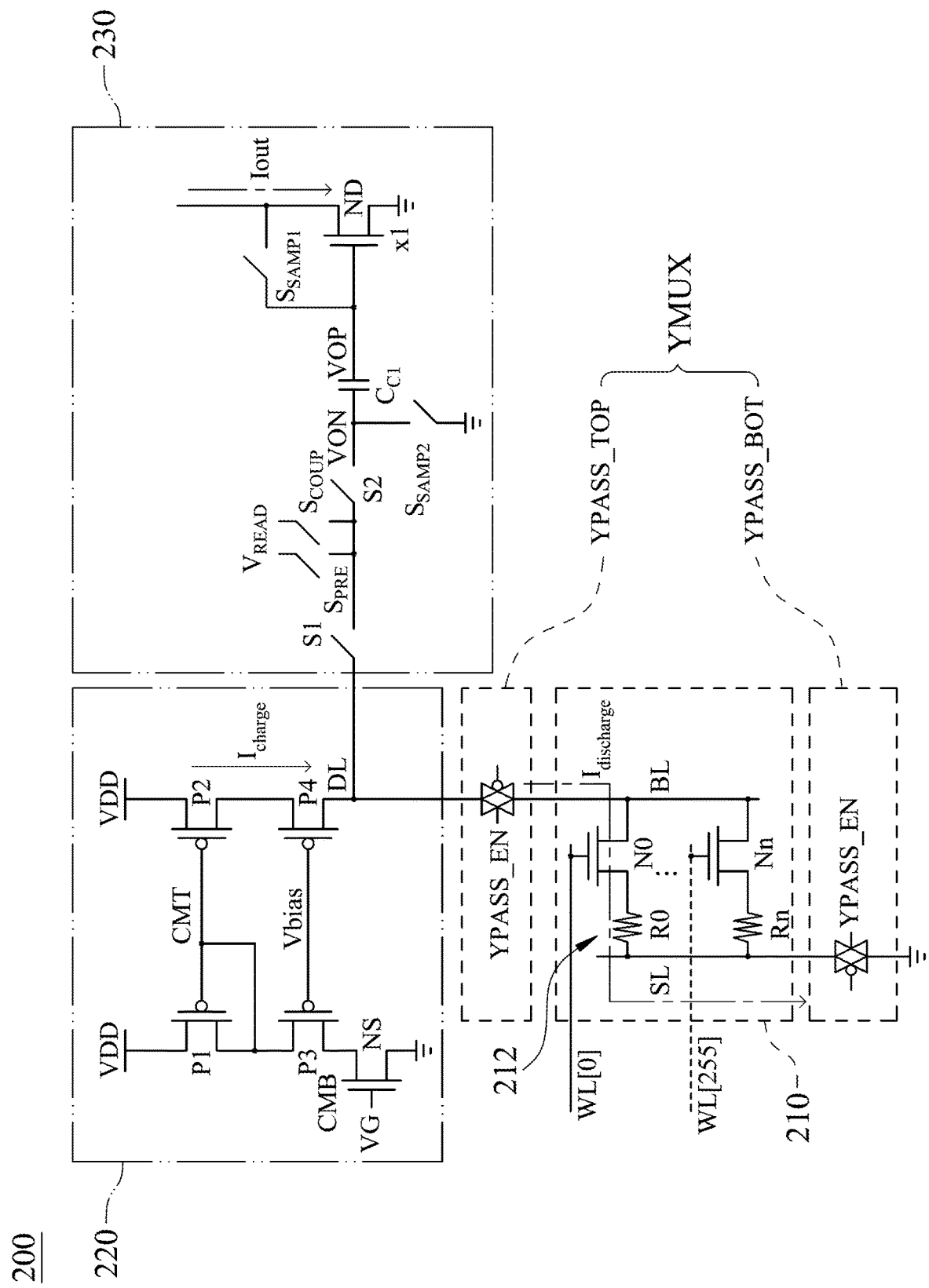
FIG. 3 shows a circuit diagram of one of the memory units of the memory array structure of FIG. 2.

FIG. 1 shows a block diagram of a memory array structure 100 with a multiply-accumulate (MAC) assist scheme for a plurality of multi-bit convolutional neural network (CNN) based computing-in-memory (CIM) applications according to a first embodiment of the present disclosure. FIG. 2 shows a circuit diagram of a plurality of memory units 200 of the memory array structure 100 of FIG. 1. FIG. 3 shows a circuit diagram of one of the memory units 200 of the memory array structure 100 of FIG. 2. In FIGS. 1-3, the memory array structure 100 with the MAC assist scheme for the multi-bit CNN based CIM applications includes the memory units 200, a word line driver 300 and a normal input-output (IO) circuit 400.

Each of the memory units 200 with the MAC assist scheme for the multi-bit CNN based CIM applications is controlled by a reference voltage VG, a plurality of word lines WL[0]-WL[n] and a multi-bit input voltage $V_{READ}$. The memory unit 200 includes a non-volatile memory array 210, a multiplexer YMUX, a voltage divider 220 and a voltage keeper 230.

The non-volatile memory array 210 includes a plurality of non-volatile memory cells 212. Each of the non-volatile memory cells 212 is controlled by one of the word lines WL[0]-WL[n] and stores a weight. In detail, each of the non-volatile memory cells 212 may be a resistive random access memory (ReRAM). The non-volatile memory cells 212 include a plurality of transistors N0-Nn and a plurality of resistive elements R0-Rn. n is a positive integer, such as 255. Each of the non-volatile memory cells 212 includes one of the transistors N0-Nn and one of the resistive elements R0-Rn. For example, the transistor N0 is connected to a bit line BL, and the resistive element R0 is connected between the transistor N0 and a source line SL, as shown in FIG. 3.

The multiplexer YMUX includes a first transmission gate YPASS_TOP and a second transmission gate YPASS_BOT. The first transmission gate YPASS_TOP is connected between the non-volatile memory cell 212 and the voltage divider 220. The second transmission gate YPASS_BOT is connected between the non-volatile memory cell 212 and the ground voltage VSS. The first transmission gate YPASS_TOP and the second transmission gate YPASS_BOT are controlled by a pass enable signal YPASS_EN. In other words, the bit line BL is connected to the voltage divider 220 via the first transmission gate YPASS_TOP, and the source line SL is connected to the ground voltage VSS via the second transmission gate YPASS_BOT.

The voltage divider 220 is connected to the non-volatile memory cell 212 and controlled by the reference voltage VG. The voltage divider 220 includes a data line DL and generates a charge current $I_{charge}$ on the data line DL according to the reference voltage VG, and a voltage level $V_{DL}$ of the data line DL is generated by the non-volatile memory cell 212 and the charge current $I_{charge}$. In detail, the voltage divider 220 includes a first transistor P1, a second transistor P2, a third transistor P3, a fourth transistor P4 and a fifth transistor NS. The first transistor P1 is connected to the power supply voltage VDD and a first divider node CMT. The second transistor P2 is connected to the power supply voltage VDD, the first divider node CMT and a second divider node CM1. The third transistor P3 is connected to the first divider node CMT, a third divider node and a fourth divider node CMB. The fourth transistor P4 is connected to the second divider node CM1, the third divider node and the data line DL. The fifth transistor NS is connected to the fourth divider node CMB, the reference voltage VG and the ground voltage VSS. Each of the first transistor P1, the second transistor P2, the third transistor P3 and the fourth transistor P4 is the NMOS transistor. The fifth transistor NS is the PMOS transistor.

The voltage keeper 230 is connected to the voltage divider 220 via the data line DL and receives the multi-bit input voltage $V_{READ}$ and the voltage level $V_{DL}$ of the data line DL. The voltage keeper 230 generates an output current Iout on an output node according to the multi-bit input voltage $V_{READ}$ and the voltage level $V_{DL}$ of the data line DL, and the output current Iout is corresponding to the multi-bit input voltage $V_{READ}$ multiplied by the weight. In detail, the voltage keeper 230 includes a first switch S1, a precharge switch $S_{PRE}$, a coupling switch $S_{COUP}$, a second switch S2, a coupling capacitor $C_{C1}$, a first sample switch $S_{SAMP1}$, a second sample switch $S_{SAMP2}$ and an output transistor ND. The first switch S1 is connected between the data line DL and a first keeper node. The precharge switch $S_{PRE}$ is connected between an input node and the first keeper node. The multi-bit input voltage $V_{READ}$ is applied to the input node. The coupling switch $S_{COUP}$ is connected between the input node and the first keeper node. The second switch S2 is connected between the first keeper node and a second keeper node VON. The coupling capacitor $C_{C1}$ is connected between the second keeper node VON and a third keeper node VOP. The first sample switch $S_{SAMP1}$ is connected between the third keeper node VOP and the output node. The second sample switch $S_{SAMP2}$ is connected between the second keeper node VON and the ground voltage VSS. The output transistor ND is connected to the output node, the third keeper node VOP and the ground voltage VSS. The output transistor ND is the NMOS transistor.

The word line driver 300 is connected to each of the memory units 200 via the word lines WL[0]-WL[n]. The word line driver 300 is represented as "WLD" and is located on a left side of the memory units 200. The word line driver 300 generates the voltage level of the word lines WL[0]-WL[n] to control each of the memory units 200.

The normal IO circuit 400 is connected to each of the memory units 200. The normal IO circuit 400 is represented as "Normal IO" and is located on a bottom side of the memory units 200. The normal IO circuit 400 receives the output currents Iout[0]-Iout[m] from the memory units 200.

Figure 4:
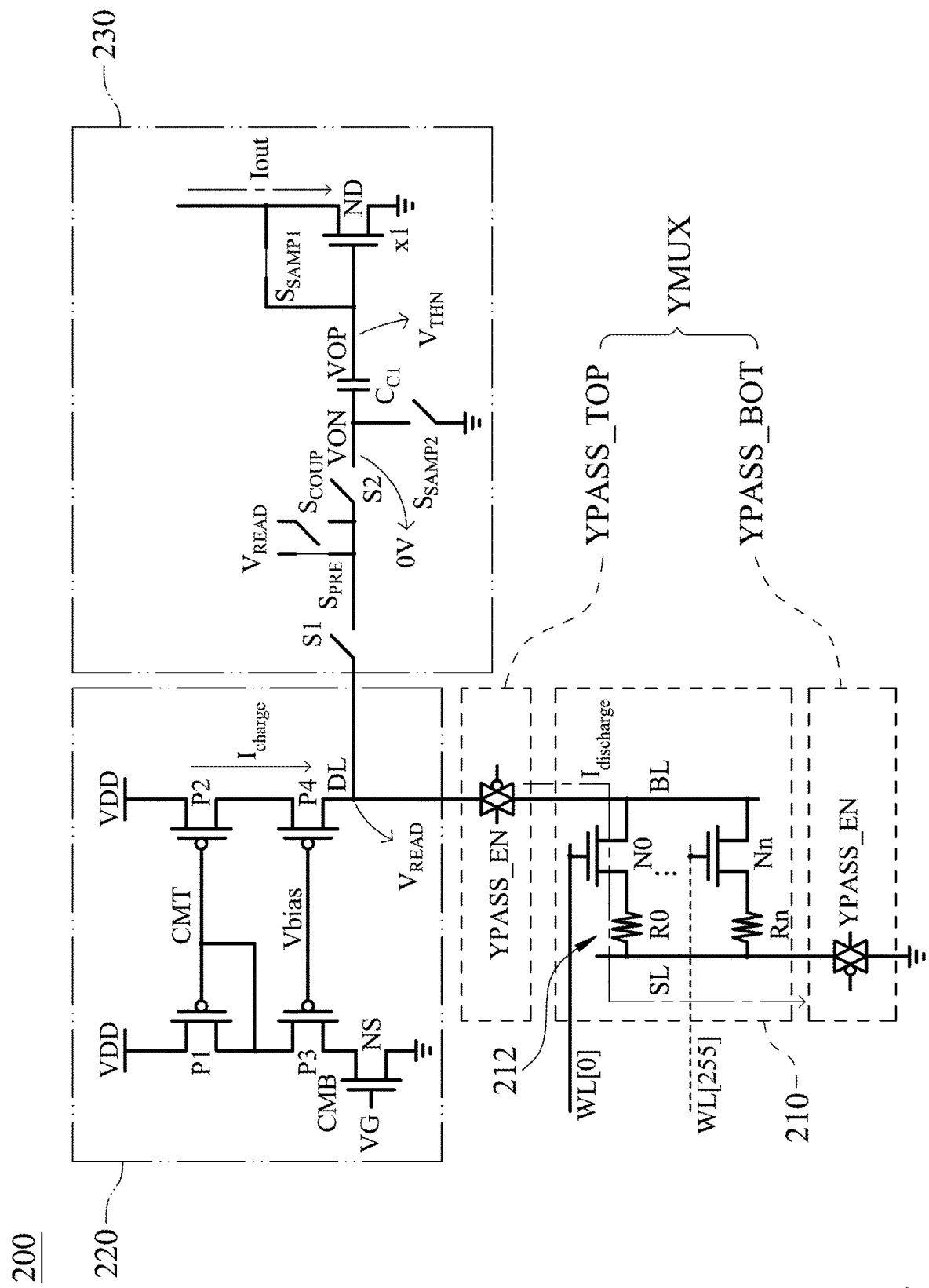
FIG. 4 shows a circuit diagram of a first operation of the one of the memory units of FIG. 3, during a first time interval.
Figure 5:
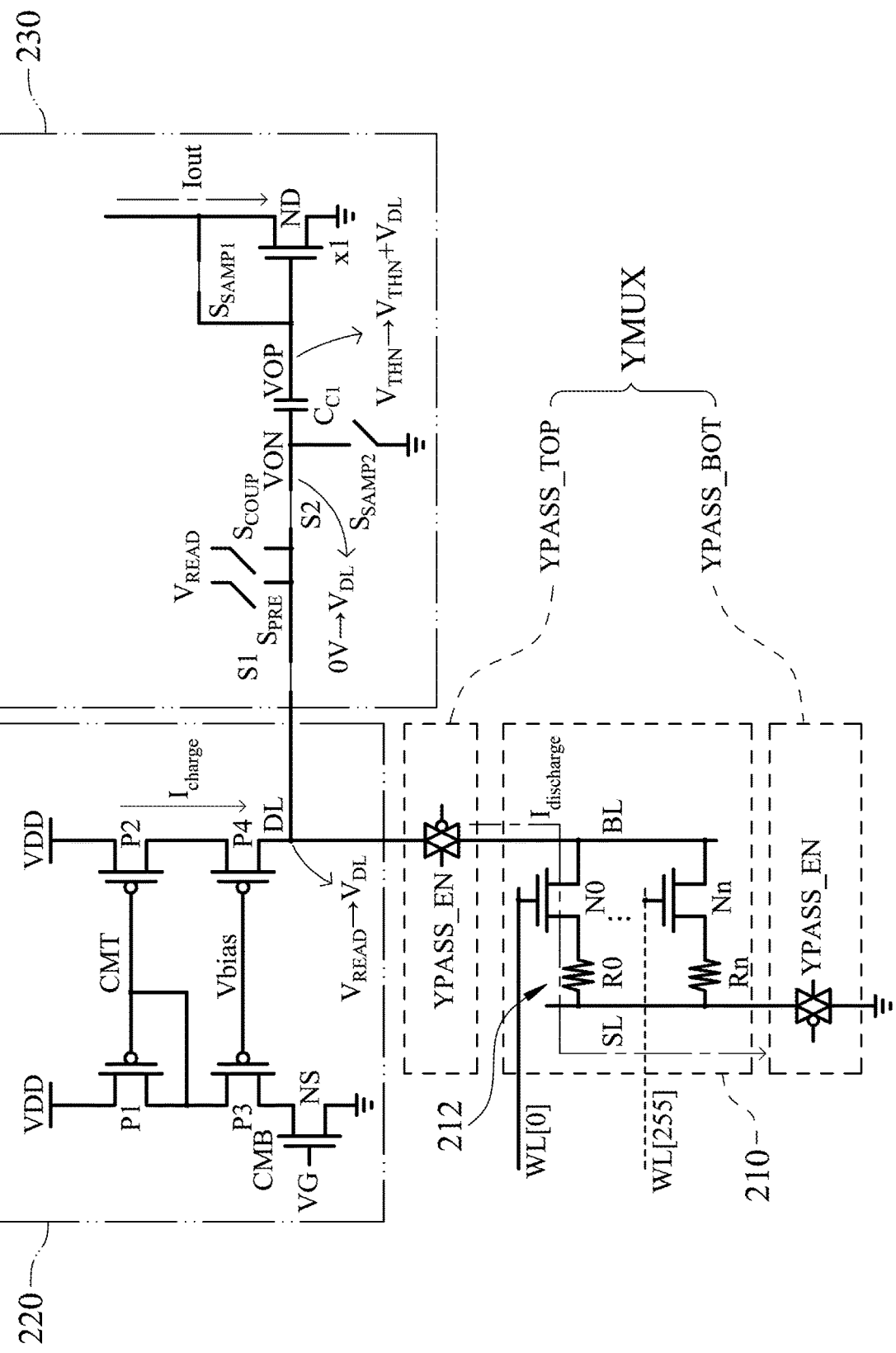
FIG. 5 shows a circuit diagram of a second operation of the one of the memory units of FIG. 3, during a second time interval.
Figure 6:
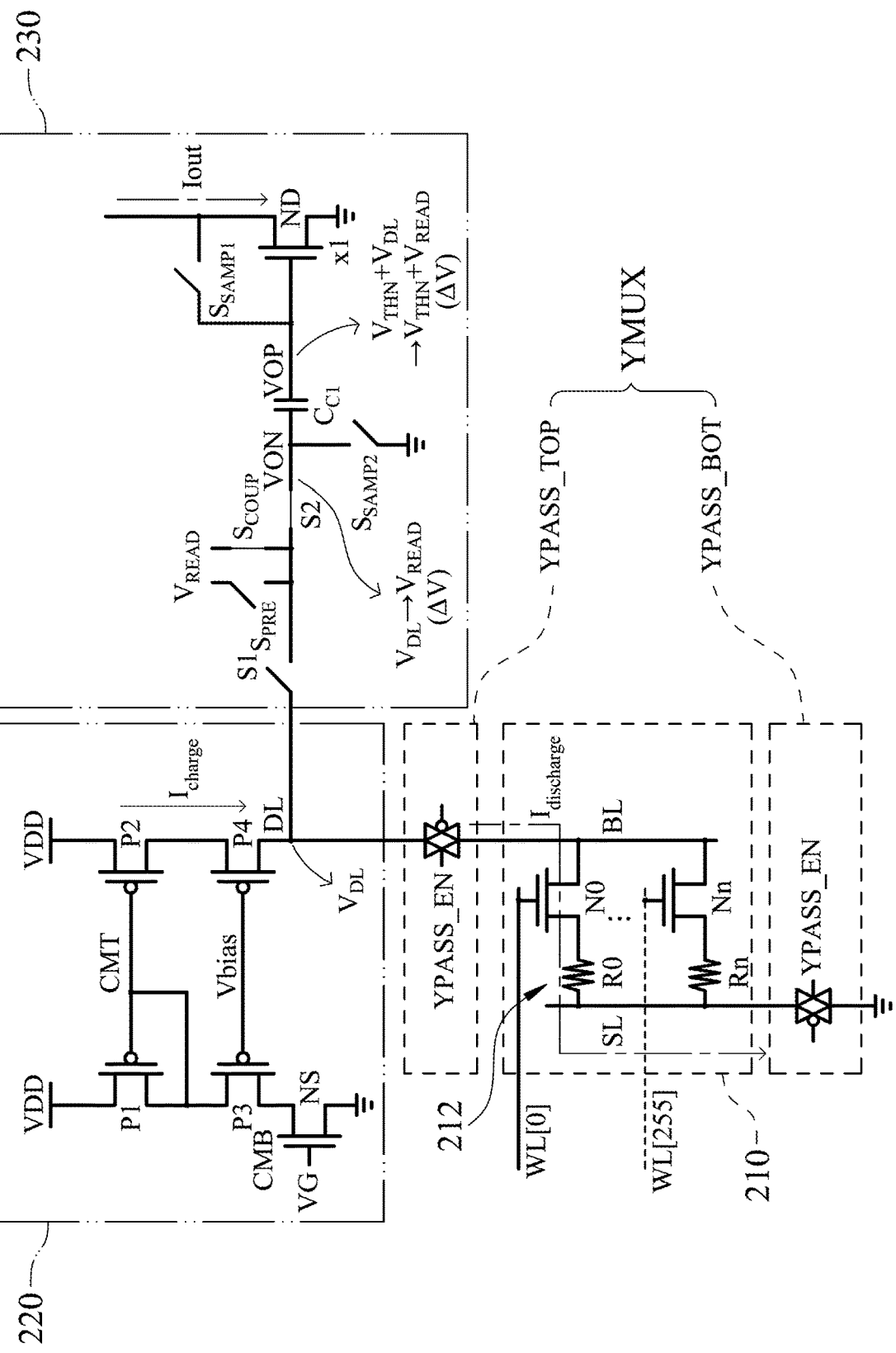
FIG. 6 shows a circuit diagram of a third operation of the one of the memory units of FIG. 3, during a third time interval.
Figure 8:
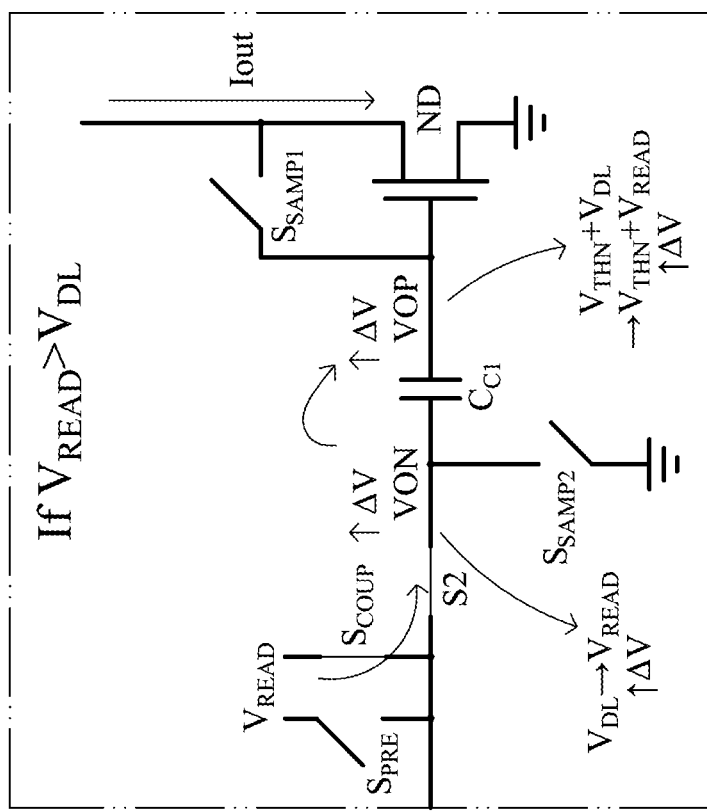
FIG. 8 shows a circuit diagram of the voltage keeper of the one of the memory units of FIG. 6, when the multi-bit input voltage is greater than the voltage level of the data line.
Figure 7:
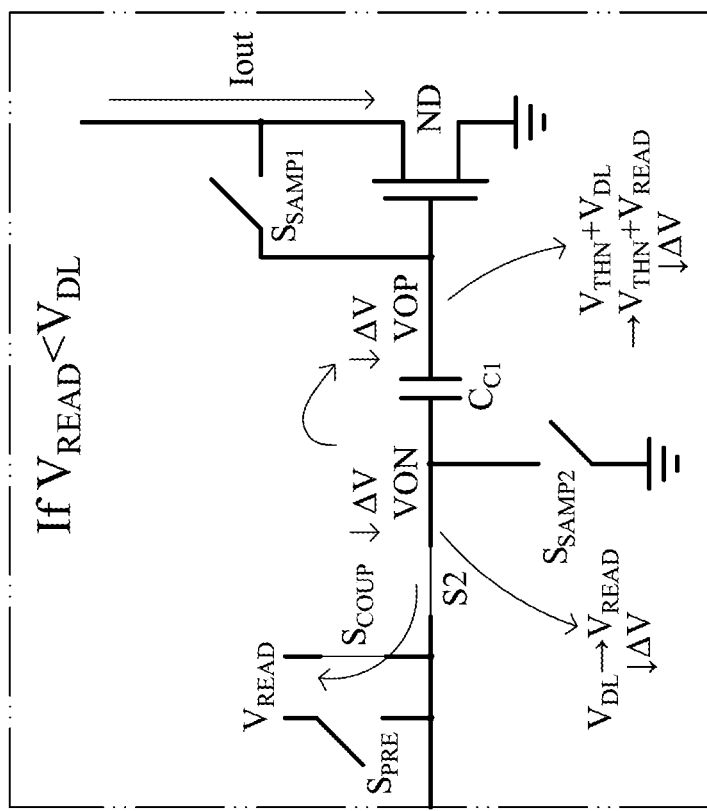
FIG. 7 shows a circuit diagram of a voltage keeper of the one of the memory units of FIG. 6, when a multi-bit input voltage is smaller than a voltage level of a data line.
Figure 9:
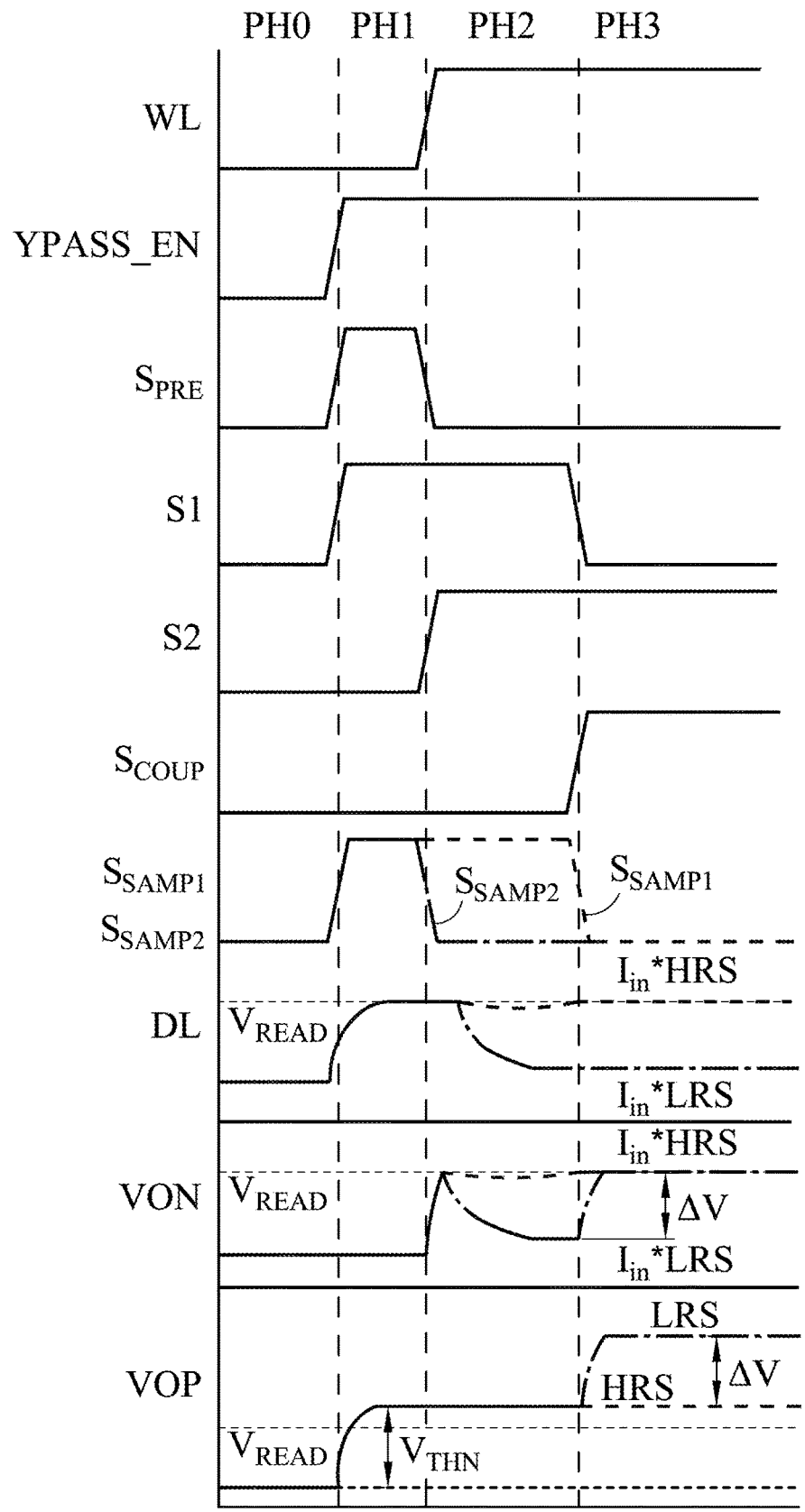
FIG. 9 shows timing diagrams of the one of the memory units of FIGS. 3-8.

FIG. 4 shows a circuit diagram of a first operation of the one of the memory units 200 of FIG. 3, during a first time interval PH1. FIG. 5 shows a circuit diagram of a second operation of the one of the memory units 200 of FIG. 3, during a second time interval PH2. FIG. 6 shows a circuit diagram of a third operation of the one of the memory units 200 of FIG. 3, during a third time interval PH3. FIG. 7 shows a circuit diagram of a voltage keeper 230 of the one of the memory units 200 of FIG. 6, when the multi-bit input voltage $V_{READ}$ is smaller than the voltage level $V_{DL}$ of the data line DL. FIG. 8 shows a circuit diagram of the voltage keeper 230 of the one of the memory units 200 of FIG. 6, when the multi-bit input voltage $V_{READ}$ is greater than the voltage level $V_{DL}$ of the data line DL. FIG. 9 shows timing diagrams of the one of the memory units 200 of FIGS. 3-8. In FIGS. 3 and 9, when the memory unit 200 is operated during an initial time interval PH0, the first switch S1, the second switch S2, the precharge switch $S_{PRE}$, the coupling switch $S_{COUP}$, the first sample switch $S_{SAMP1}$ and the second sample switch $S_{SAMP2}$ are turned off. A voltage level Vbias of the third divider node of the voltage divider 220 is set to allow the third transistor P3 and the fourth transistor P4 of the voltage divider 220 to be operated in a saturation region.

In FIGS. 4 and 9, when the memory unit 200 is operated during the first time interval PH1, the first switch S1 and the precharge switch $S_{PRE}$ are turned on to precharge a voltage level of the data line DL to the multi-bit input voltage $V_{READ}$. The first sample switch $S_{SAMP1}$ and the second sample switch $S_{SAMP2}$ are turned on to store a threshold voltage $V_{THN}$ of the output transistor ND at the coupling capacitor $C_{C1}$. The second switch S2 and the coupling switch $S_{COUP}$ are turned off. The first time interval PH1 follows the initial time interval PH0.

In FIGS. 5 and 9, when the memory unit 200 is operated during the second time interval PH2, the first switch S1, the second switch S2 and the first sample switch $S_{SAMP1}$ are turned on. The precharge switch $S_{PRE}$, the coupling switch $S_{COUP}$ and the second sample switch $S_{SAMP2}$ are turned off. The voltage level of the data line DL is equal to a voltage level of the second keeper node VON, and the voltage level $V_{DL}$ of the data line DL is determined by the charge current $I_{charge}$ of the data line DL and one of the resistive elements R0-Rn of the non-volatile memory cell 212. The second time interval PH2 follows the first time interval PH1.

In FIGS. 6 and 9, when the memory unit 200 is operated during the third time interval PH3, the coupling switch $S_{COUP}$ and the second switch S2 are turned on to change the voltage level of the second keeper node VON from the voltage level $V_{DL}$ of the data line DL to the multi-bit input voltage $V_{READ}$, so that there is a voltage variation $\Delta V$ on each of the second keeper node VON and the third keeper node VOP via the coupling capacitor $C_{C1}$. The first switch S1, the precharge switch $S_{PRE}$, the first sample switch $S_{SAMP1}$ and the second sample switch $S_{SAMP2}$ are turned off. The output transistor ND is controlled by a voltage level of the third keeper node VOP to generate the output current Iout. The third time interval PH3 follows the second time interval PH2.

In FIGS. 7 and 9, when the multi-bit input voltage $V_{READ}$ is smaller than the voltage level $V_{DL}$ of the data line DL during the third time interval PH3, the voltage level of the second keeper node VON is decreased according to the voltage variation $\Delta V$. The voltage variation $\Delta V$ is decreased and coupled from the second keeper node VON to the third keeper node VOP through the coupling capacitor $C_{C1}$, and the voltage variation $\Delta V$ is equal to the voltage level $V_{DL}$ of the data line DL minus the multi-bit input voltage $V_{READ}$, i.e., $\Delta V = V_{DL} - V_{READ}$. On the contrary, when the multi-bit input voltage $V_{READ}$ is greater than the voltage level $V_{DL}$ of the data line DL during the third time interval PH3, the voltage level of the second keeper node VON is increased according to the voltage variation $\Delta V$. The voltage variation $\Delta V$ is increased and coupled from the second keeper node VON to the third keeper node VOP through the coupling capacitor $C_{C1}$, and the voltage variation $\Delta V$ is equal to the multi-bit input voltage $V_{READ}$ minus the voltage level $V_{DL}$ of the data line DL, i.e., $\Delta V = V_{READ} - V_{DL}$.

Table 1 lists one example of the multi-bit input voltages $V_{READ}$ and the charge currents $I_{charge}$ of the memory unit 200 in FIG. 3. In FIG. 3, the output transistor ND may be operated in a triode region for applying to multi-bit inputs. The multi-bit input voltages $V_{READ}$ can be represented as the multi-bit inputs (e.g., 2-bit inputs). The charge currents $I_{charge}$ are changed within the multi-bit inputs.

TABLE 1

| 2-bit Input | $V_{READ}$ ($V_{INPUT}$) | $I_{charge}$ |
| --- | --- | --- |
| 0 | 0 V | 0x |
| 1 | 0.08 V | 1x |
| 2 | 0.16 V | 2x |
| 3 | 0.24 V | 3x |

Figure 10:
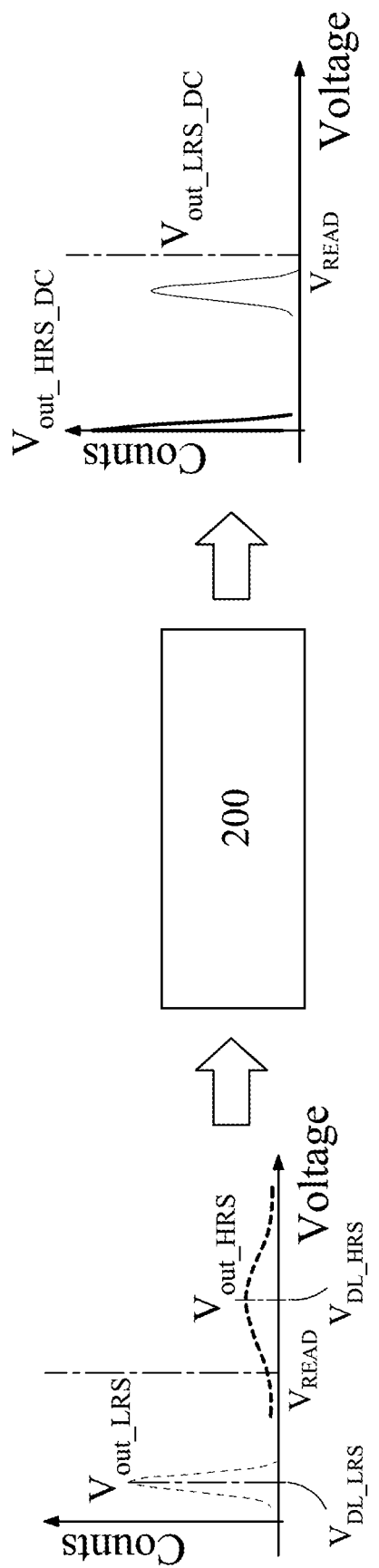
FIG. 10 shows a schematic view of a voltage distribution of the data line of the one of the memory units of FIG. 3.
Figure 11:
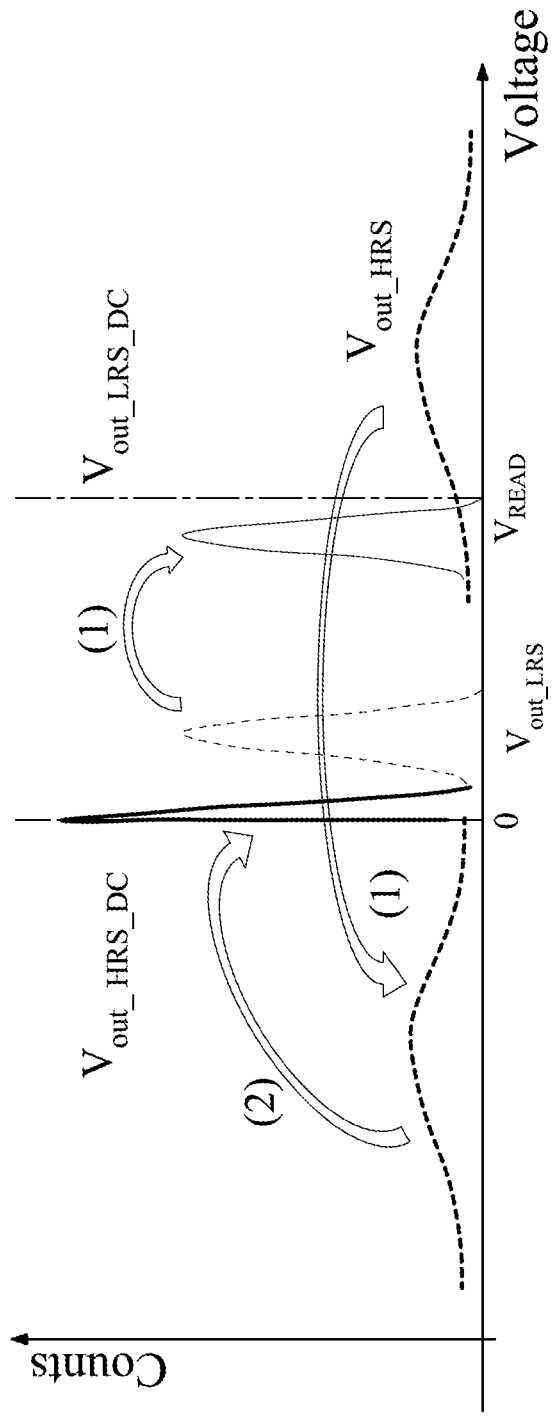
FIG. 11 shows a schematic view of a variation of the voltage distribution of the data line of the memory unit of FIG. 10.

FIG. 10 shows a schematic view of a voltage distribution of the data line DL of the one of the memory units 200 of FIG. 3. FIG. 11 shows a schematic view of a variation of the voltage distribution of the data line DL of the memory unit 200 of FIG. 10. In FIGS. 3, 10 and 11, one of the resistive elements R0-Rn of the non-volatile memory cell 212 is in one of a high resistance state (HRS) and a low resistance state (LRS). The voltage level $V_{DL}$ of the data line DL has a high-voltage mean value $V_{DL\_HRS}$ and a low-voltage mean value $V_{DL\_LRS}$. In other words, when the one of the resistive elements R0-Rn is in the HRS, the voltage level $V_{DL}$ of the data line DL generates a HRS output voltage distribution $V_{out\_HRS}$, and the HRS output voltage distribution $V_{out\_HRS}$ has the high-voltage mean value $V_{DL\_HRS}$. When the one of the resistive elements R0-Rn is in the LRS, the voltage level $V_{DL}$ of the data line DL generates a LRS output voltage distribution $V_{out\_LRS}$, and the LRS output voltage distribution $V_{out\_LRS}$ has the low-voltage mean value $V_{DL\_LRS}$. The high-voltage mean value $V_{DL\_HRS}$ represents one mean value of the voltage level $V_{DL}$ of the data line DL when the one of the resistive elements R0-Rn is in the HRS. The low-voltage mean value $V_{DL\_LRS}$ represents another mean value of the voltage level $V_{DL}$ of the data line DL when the one of the resistive elements R0-Rn is in the LRS. The multi-bit input voltage $V_{READ}$ is set to be smaller than the high-voltage mean value $V_{DL\_HRS}$ and greater than the low-voltage mean value $V_{DL\_LRS}$. Then, a distance-calibrated HRS output voltage distribution $V_{out\_HRS\_DC}$ and a distance-calibrated LRS output voltage distribution $V_{out\_LRS\_DC}$ are generated according to the HRS output voltage distribution $V_{out\_HRS}$, the LRS output voltage distribution $V_{out\_LRS}$ and the multi-bit input voltage $V_{READ}$. In addition, the multi-bit input voltage $V_{READ}$ can be set near a lower bond of the high-voltage mean value $V_{DL\_HRS}$. Much better if multi-bit input voltage $V_{READ}$ is applied much closer a lower bound of the low-voltage mean value $V_{DL\_LRS}$, but less margin can be gained, so that there is a trade-off between margin and missing cell which cannot be eliminated. Accordingly, the memory unit 200 of the present disclosure can calibrate the variation of the non-volatile memory cells 212 for summation, and eliminate large DC currents within MAC operations and leakage currents of the non-volatile memory cells 212, thereby offering DC current reduction at the data line DL for the output current Iout generation and better linearity in multi-bit applications. In addition, the distribution ($V_{out\_LRS}$) of the voltage level $V_{DL}$ of the data line DL can be narrowed when the resistive element is in the LRS, and the influence of the distribution ($V_{out\_HRS}$) of the voltage level $V_{DL}$ of the data line DL can be eliminated when the resistive element is in the HRS.

Figure 12:
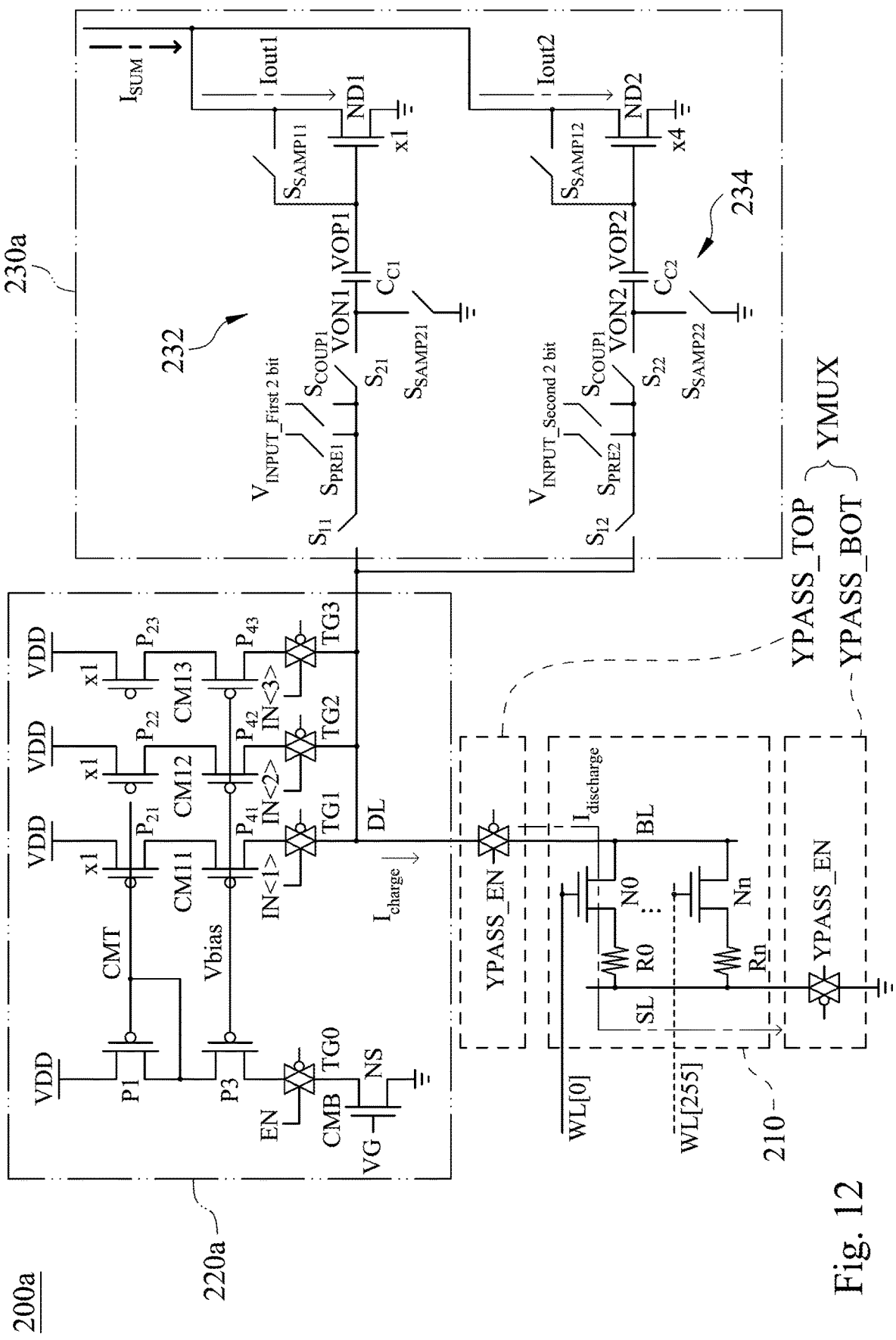
FIG. 12 shows a circuit diagram of a memory unit with a multiply-accumulate assist scheme for a plurality of multi-bit convolutional neural network based computing-in-memory applications according to a second embodiment of the present disclosure.

FIG. 12 shows a circuit diagram of a memory unit 200a with a multiply-accumulate assist scheme for a plurality of multi-bit convolutional neural network based computing-in-memory applications according to a second embodiment of the present disclosure. The memory unit 200a includes a non-volatile memory array 210, a multiplexer YMUX, a voltage divider 220a and a voltage keeper 230a. In FIG. 12, the detail of the non-volatile memory array 210 and the multiplexer YMUX is the same as the embodiments of FIG. 3, and will not be described again herein. In FIG. 12, the memory unit 200a further includes the voltage divider 220a and the voltage keeper 230a.

The voltage divider 220a includes a first transistor P1, a second transistor P21, a third transistor P3, a fourth transistor P41, a fifth transistor NS, a control divider transmission gate TG0, a first divider transmission gate TG1, a sixth transistor P22, a seventh transistor P42, a second divider transmission gate TG2, an eighth transistor P23, a ninth transistor P43 and a third divider transmission gate TG3. The first transistor P1 is connected to the power supply voltage VDD and a first divider node CMT. The second transistor P21 is connected to the power supply voltage VDD, the first divider node CMT and a second divider node CM11. The second transistor P21 has a first transistor width. The third transistor P3 is connected to the first divider node CMT and a third divider node. The fourth transistor P41 is connected to the second divider node CM11 and the third divider node. The fifth transistor NS is connected to a fourth divider node CMB, the reference voltage VG and the ground voltage VSS. The control divider transmission gate TG0 is connected between the third transistor P3 and the fifth transistor NS. The control divider transmission gate TG0 is connected to the fifth transistor NS via the fourth divider node CMB. The control divider transmission gate TG0 is controlled by an input control signal EN. The first divider transmission gate TG1 is connected between the fourth transistor P41 and the data line DL. The first divider transmission gate TG1 is controlled by a first control signal IN<1>. The sixth transistor P22 is connected to the power supply voltage VDD, the first divider node CMT and a fifth divider node CM12. The sixth transistor P22 has a second transistor width. The seventh transistor P42 is connected to the fifth divider node CM12 and the third divider node. The second divider transmission gate TG2 is connected between the seventh transistor P42 and the data line DL. The second divider transmission gate TG2 is controlled by a second control signal IN<2>. The eighth transistor P23 is connected to the power supply voltage VDD, the first divider node CMT and a sixth divider node CM13. The eighth transistor P23 has a third transistor width. The ninth transistor P43 is connected to the sixth divider node CM13 and the third divider node. The third divider transmission gate TG3 is connected between the ninth transistor P43 and the data line DL. The third divider transmission gate TG3 is controlled by a third control signal IN<3>. The first transistor width, the second transistor width and the third transistor width are equal to each other. Each of the first transistor P1, the second transistor P21, the third transistor P3, the fourth transistor P41, the sixth transistor P22, the seventh transistor P42, the eighth transistor P23 and the ninth transistor P43 is the NMOS transistor. The fifth transistor NS is the PMOS transistor.

The voltage keeper 230a includes two voltage sub-keepers 232, 234. The voltage sub-keeper 232 includes a first switch S11, a precharge switch $S_{PRE1}$, a coupling switch $S_{COUP1}$, a second switch S21, a coupling capacitor $C_{C1}$, a first sample switch $S_{SAMP11}$, a second sample switch $S_{SAMP21}$ and an output transistor ND1. The first switch S11 is connected between the data line DL and a first keeper node. The precharge switch $S_{PRE1}$ is connected between an input node and the first keeper node. The multi-bit input voltage $V_{INPUT\_First\ 2\ bit}$ is applied to the input node. The coupling switch $S_{COUP1}$ is connected between the input node and the first keeper node. The second switch S21 is connected between the first keeper node and a second keeper node VON1. The coupling capacitor $C_{C1}$ is connected between the second keeper node VON1 and a third keeper node VOP1. The first sample switch $S_{SAMP11}$ is connected between the third keeper node VOP1 and the output node. The second sample switch $S_{SAMP21}$ is connected between the second keeper node VON1 and the ground voltage VSS. The output transistor ND1 is connected to the output node, the third keeper node VOP1 and the ground voltage VSS. The output transistor ND1 has a first output transistor width. In addition, the voltage sub-keeper 234 includes a first switch S12, a precharge switch $S_{PRE2}$, a coupling switch $S_{COUP2}$, a second switch S22, a coupling capacitor $C_{C2}$, a first sample switch $S_{SAMP12}$, a second sample switch $S_{SAMP22}$ and an output transistor ND2. The detail of the first switch S12, the precharge switch $S_{PRE2}$, the coupling switch $S_{COUP2}$, the second switch S22, the coupling capacitor $C_{C2}$, the first sample switch $S_{SAMP12}$ and the second sample switch $S_{SAMP22}$ is the same as the first switch S11, the precharge switch $S_{PRE1}$, the coupling switch $S_{COUP1}$, the second switch S21, the coupling capacitor $C_{C1}$, the first sample switch $S_{SAMP11}$ and the second sample switch $S_{SAMP21}$ of the voltage sub-keeper 232, and will not be described again herein. In the voltage sub-keeper 234, the output transistor ND2 has a second output transistor width. The second output transistor width is equal to four times the first output transistor width of the output transistor ND1.

Table 2 lists the multi-bit input voltages $V_{INPUT\_First\ 2\ bit}$, $V_{INPUT\_Second\ 2\ bit}$, the first control signals IN<1>, the second control signals IN<2>, the third control signals IN<3> and the charge currents $I_{charge}$ of the memory unit 200a of FIG. 12. Each of the multi-bit input voltages $V_{INPUT\_First\ 2\ bit}$, $V_{INPUT\_Second\ 2\ bit}$ may be corresponding to a 2-bit input, so that the memory unit 200a can be operated with a 4-bit solution. Table 2 lists one application of the 4-bit solution of the memory unit 200a of FIG. 12. In FIG. 12, the voltage divider 220a may be operated as a digital-to-analog converter (DAC) within multi-bit applications. There are three charge current paths controlled by the first control signal IN<1>, the second control signal IN<2> and the third control signal IN<3>, respectively. The three charge current paths pass through the first divider transmission gate TG1, the second divider transmission gate TG2 and the third divider transmission gate TG3, respectively. Each of the three charge current paths provides a sub-charge current (1×) on each of the first divider transmission gate TG1, the second divider transmission gate TG2 and the third divider transmission gate TG3. Moreover, the voltage keeper 230a processes sequential inputs (i.e., the multi-bit input voltages $V_{INPUT\_First\ 2\ bit}$, $V_{INPUT\_Second\ 2\ bit}$) and keeps voltages (i.e., voltage levels of the second keeper nodes VON1, VON2 and the third keeper nodes VOP1, VOP2) corresponding to the sequential inputs in different voltage sub-keepers 232, 234 so as to generate a sum current $I_{sum}$ according to a first output current Iout1 and a second output current Iout2 (i.e., $I_{sum}=1\times Iout1+4\times Iout2$).

TABLE 2

| 2-bit Input | IN<1> | IN<2> | IN<3> | $V_{READ}$ ($V_{INPUT\_First\ 2\ bit}$/ $V_{INPUT\_Second\ 2\ bit}$) | $I_{charge}$ |
|---|---|---|---|---|---|
| 0 | off | off | off | 0 V | 0x |
| 1 | on | off | off | 0.1 V | 1x |
| 2 | on | on | off | 0.2 V | 2x |
| 3 | on | on | on | 0.3 V | 3x |

Figure 13:
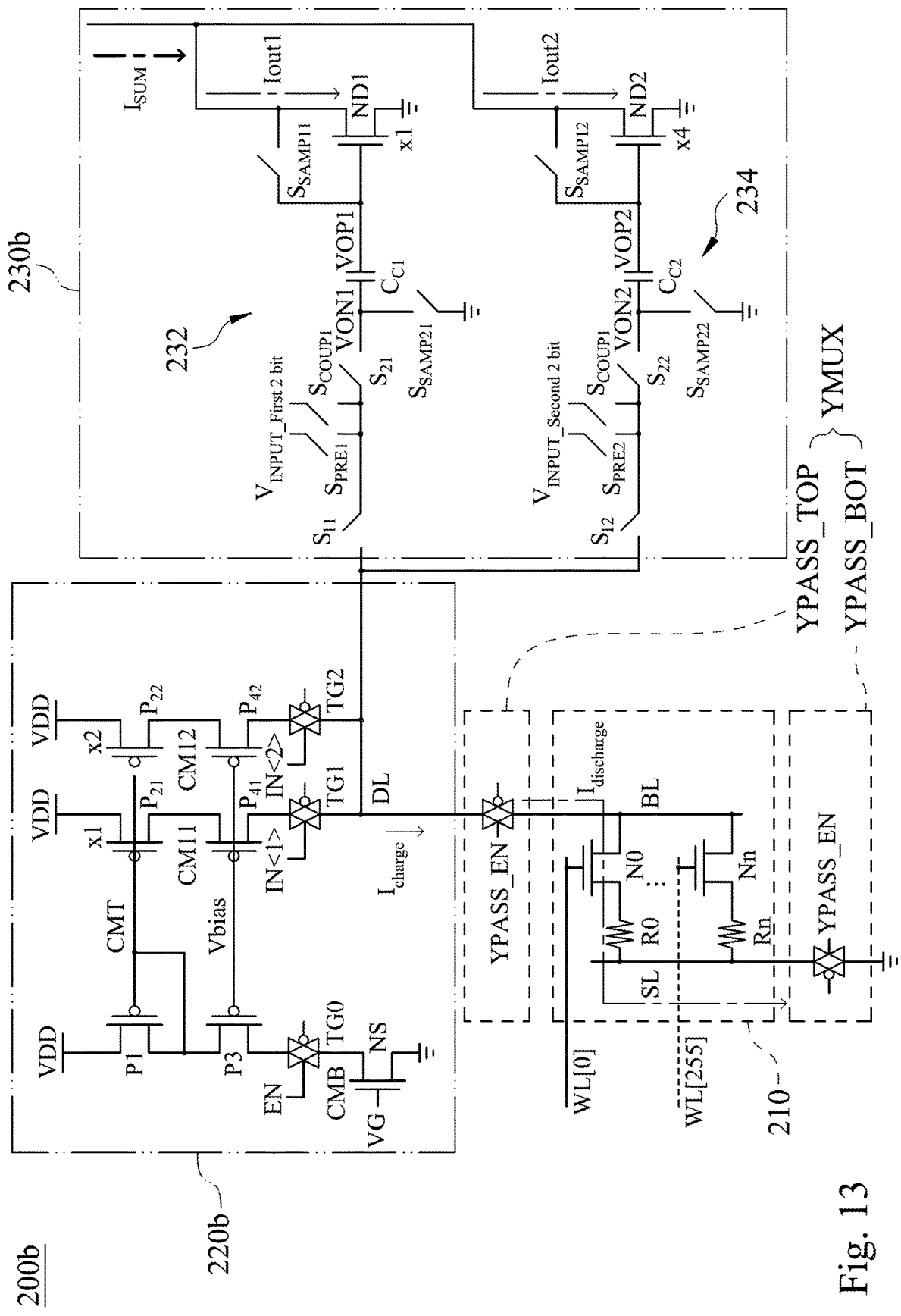
FIG. 13 shows a circuit diagram of a memory unit with a multiply-accumulate assist scheme for a plurality of multi-bit convolutional neural network based computing-in-memory applications according to a third embodiment of the present disclosure.

FIG. 13 shows a circuit diagram of a memory unit 200b with a multiply-accumulate assist scheme for a plurality of multi-bit convolutional neural network based computing-in-memory applications according to a third embodiment of the present disclosure. The memory unit 200b includes a non-volatile memory array 210, a multiplexer YMUX, a voltage divider 220b and a voltage keeper 230b. In FIG. 13, the detail of the non-volatile memory array 210, the multiplexer YMUX and the voltage keeper 230b is the same as the non-volatile memory array 210, the multiplexer YMUX and the voltage keeper 230a of FIG. 12, and will not be described again herein. In FIG. 13, the memory unit 200b further includes the voltage divider 220b. The voltage divider 220b includes a first transistor P1, a second transistor P21, a third transistor P3, a fourth transistor P41, a fifth transistor NS, a control divider transmission gate TG0, a first divider transmission gate TG1, a sixth transistor P22, a seventh transistor P42 and a second divider transmission gate TG2. The detail of the first transistor P1, the second transistor P21, the third transistor P3, the fourth transistor P41, the fifth transistor NS, the control divider transmission gate TG0, the first divider transmission gate TG1, the seventh transistor P42 and the second divider transmission gate TG2 is the same as the embodiments of FIG. 12, and will not be described again herein. The second transistor P21 has a first transistor width, and the sixth transistor P22 has a second transistor width. The second transistor width is equal to twice the first transistor width.

Table 3 lists the multi-bit input voltages $V_{INPUT\_First\ 2\ bit}$, $V_{INPUT\_Second\ 2\ bit}$, the first control signals IN<1>, the second control signals IN<2> and the charge currents $I_{charge}$ of the memory unit 200b of FIG. 13. Each of the multi-bit input voltages $V_{INPUT\_First\ 2\ bit}$, $V_{INPUT\_Second\ 2\ bit}$ may be corresponding to a 2-bit input, so that the memory unit 200b can be operated with a 4-bit solution. Table 3 lists one application of the 4-bit solution of the memory unit 200b of FIG. 13. In FIG. 13, the voltage divider 220b may be operated as a digital-to-analog converter within multi-bit applications. There are two charge current paths controlled by the first control signal IN<1> and the second control signal IN<2>, respectively. The two charge current paths pass through the first divider transmission gate TG1 and the second divider transmission gate TG2, respectively. The charge current path controlled by the first control signal IN<1> provides a first sub-charge current (1×) on the first divider transmission gate TG1. The charge current path controlled by the second control signal IN<2> provides a second sub-charge current (2×) on the second divider transmission gate TG2. The second sub-charge current is equal to twice the first sub-charge current. Furthermore, the voltage keeper 230b processes sequential inputs (i.e., the multi-bit input voltages $V_{INPUT\_First\ 2\ bit}$, $V_{INPUT\_Second\ 2\ bit}$) and keeps voltages (i.e., voltage levels of the second keeper nodes VON1, VON2 and the third keeper nodes VOP1, VOP2) corresponding to the sequential inputs in different voltage sub-keepers 232, 234 so as to generate a sum current $I_{sum}$ according to a first output current Iout1 and a second output current Iout2 (i.e., $I_{sum}=1\times Iout1+4\times Iout2$).

TABLE 3

| 2-bit Input | IN<1> | IN<2> | $V_{READ}$ ($V_{INPUT\_First\ 2\ bit}$/ $V_{INPUT\_Second\ 2\ bit}$) | $I_{charge}$ |
|---|---|---|---|---|
| 0 | off | off | 0 V | 0x |
| 1 | on | off | 0.1 V | 1x |
| 2 | off | on | 0.2 V | 2x |
| 3 | on | on | 0.3 V | 3x |

Figure 14:
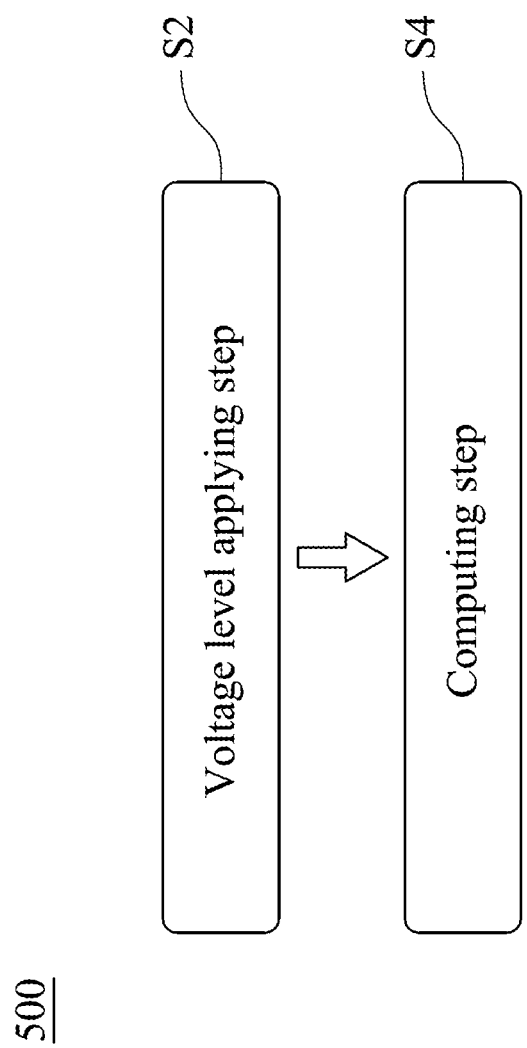
FIG. 14 shows a flow chart of a computing method of a memory unit with a multiply-accumulate assist scheme for a plurality of multi-bit convolutional neural network based computing-in-memory applications according to a fourth embodiment of the present disclosure.

FIG. 14 shows a flow chart of a computing method 500 of a memory unit (e.g., one of the memory unit 200 of FIG. 3, the memory unit 200a of FIG. 12 and the memory unit 200b of FIG. 13) with a multiply-accumulate assist scheme for a plurality of multi-bit convolutional neural network based computing-in-memory applications according to a fourth embodiment of the present disclosure. The computing method 500 includes a voltage level applying step S2 and a computing step S4.

The voltage level applying step S2 includes applying a plurality of voltage levels to the reference voltage VG, the word lines WL[0]-WL[n] and the multi-bit input voltage (e.g., one of the multi-bit input voltage $V_{READ}$ of FIG. 3 and the multi-bit input voltages $V_{INPUT\_First\ 2\ bit}$, $V_{INPUT\_Second\ 2\ bit}$ of FIGS. 12 and 13), respectively. The computing step S4 includes driving the voltage divider (e.g., one of the voltage divider 220 of FIG. 3, the voltage divider 220a of FIG. 12 and the voltage divider 220b of FIG. 13) to generate the charge current $I_{charge}$ on the data line DL according to the reference voltage VG and generate the voltage level of the data line DL by the non-volatile memory cell 212 and the charge current $I_{charge}$, and driving the voltage keeper (e.g., one of the voltage keeper 230 of FIG. 3, the voltage keeper 230a of FIG. 12 and the voltage keeper 230b of FIG. 13) to generate the output current (e.g., one of the output current Iout of FIG. 3, the first output current Iout1 and the second output current Iout2 of FIGS. 12 and 13) on the output node according to the multi-bit input voltage and the voltage level of the data line DL.

Figure 15:
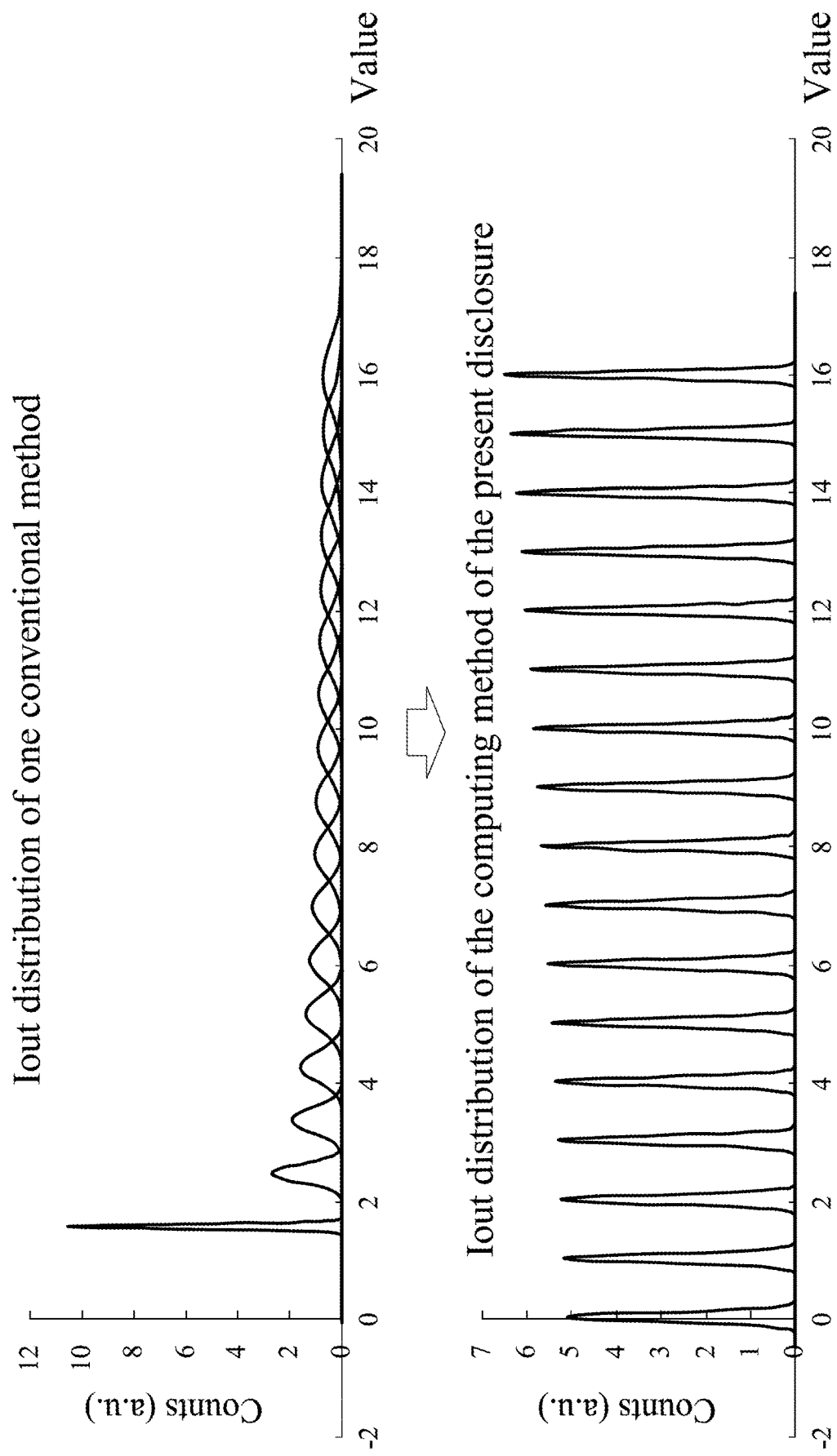
FIG. 15 shows output current distributions of one conventional method and the computing method of the present disclosure.
Figure 16:
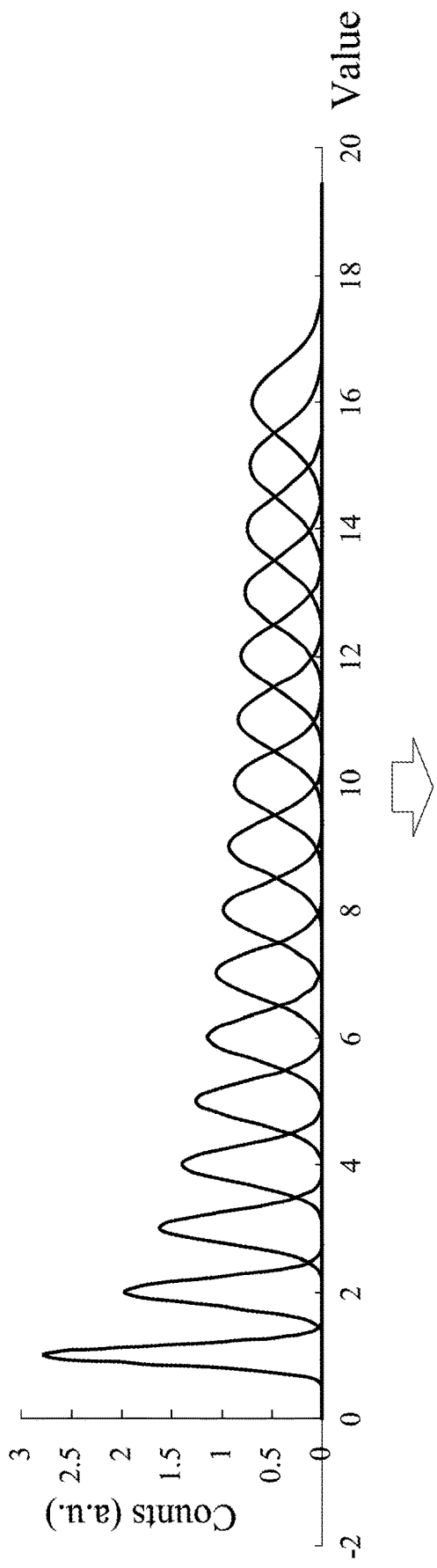
FIG. 16 shows output current distributions of another conventional method and the computing method of the present disclosure.
Figure 16:
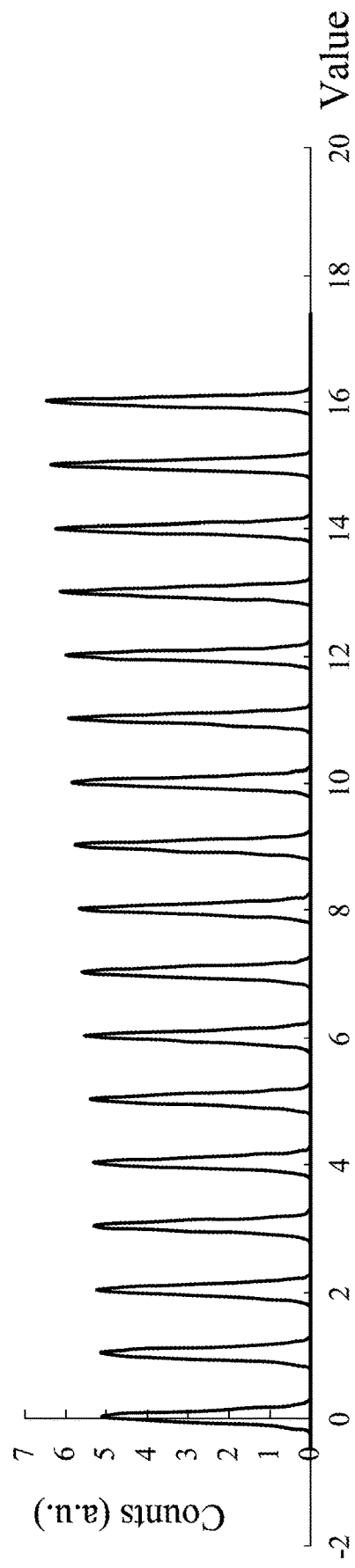

FIG. 15 shows output current (Iout) distributions of one conventional method and the computing method 500 of the present disclosure. FIG. 16 shows output current (Iout) distributions of another conventional method and the computing method 500 of the present disclosure. In FIGS. 15 and 16, the output current (Iout) distributions represent the distributions of 4-bit 17-level output currents. The one conventional method of FIG. 15 is performed with a normal process. The another conventional method of FIG. 16 is performed with LRS cancellation. It is obvious that the computing method 500 of the present disclosure can effectively calibrate the variation of the non-volatile memory cells 212 for MAC operations.

According to the aforementioned embodiments and examples, the advantages of the present disclosure are described as follows.

1. The memory unit with the MAC assist scheme for the multi-bit CNN based CIM applications and the computing method thereof of the present disclosure can calibrate the variation of the non-volatile memory cells for summation, and eliminate large DC currents within MAC operations and leakage currents of the non-volatile memory cells, thereby offering DC current reduction at the data line for the output current generation and better linearity in multi-bit applications.

2. The memory unit with the MAC assist scheme for the multi-bit CNN based CIM applications and the computing method thereof of the present disclosure can utilize a specific setting of the multi-bit input voltages to effectively calibrate the variation of the non-volatile memory cells for MAC operations. Therefore, the distribution of the voltage level of the data line can be narrowed when the resistive element is in the LRS, and the influence of the distribution of the voltage level of the data line can be eliminated when the resistive element is in the HRS.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A memory unit with a multiply-accumulate assist scheme for a plurality of multi-bit convolutional neural network based computing-in-memory applications, which is controlled by a reference voltage, a word line and a multi-bit input voltage, and the memory unit with the multiply-accumulate assist scheme for the multi-bit convolutional neural network based computing-in-memory applications comprising:
a non-volatile memory cell controlled by the word line and storing a weight;
a voltage divider connected to the non-volatile memory cell and controlled by the reference voltage, wherein the voltage divider comprises a data line and generates a charge current on the data line according to the reference voltage, and a voltage level of the data line is generated by the non-volatile memory cell and the charge current; and
a voltage keeper connected to the voltage divider via the data line and receiving the multi-bit input voltage and the voltage level of the data line, wherein the voltage keeper generates an output current on an output node according to the multi-bit input voltage and the voltage level of the data line, and the output current is corresponding to the multi-bit input voltage multiplied by the weight;
wherein the non-volatile memory cell comprises a resistive element in one of a high resistance state and a low resistance state, the voltage level of the data line has a high-voltage mean value and a low-voltage mean value, the high-voltage mean value represents one mean value of the voltage level of the data line when the resistive element is in the high resistance state, the low-voltage mean value represents another mean value of the voltage level of the data line when the resistive element is in the low resistance state, and the multi-bit input voltage is set to be smaller than the high-voltage mean value and greater than the low-voltage mean value.

2. The memory unit with the multiply-accumulate assist scheme for the multi-bit convolutional neural network based computing-in-memory applications of claim 1, wherein the non-volatile memory cell comprises:
a transistor connected to a bit line; and
the resistive element connected between the transistor and a source line;
wherein the bit line is connected to the data line, and the source line is connected to a ground voltage.

3. The memory unit with the multiply-accumulate assist scheme for the multi-bit convolutional neural network based computing-in-memory applications of claim 1, further comprising:
a first transmission gate connected between the non-volatile memory cell and the voltage divider; and
a second transmission gate connected between the non-volatile memory cell and a ground voltage;
wherein the first transmission gate and the second transmission gate are controlled by a pass enable signal.

4. The memory unit with the multiply-accumulate assist scheme for the multi-bit convolutional neural network based computing-in-memory applications of claim 1, wherein the voltage divider comprises:
a first transistor connected to a power supply voltage and a first divider node;
a second transistor connected to the power supply voltage, the first divider node and a second divider node;
a third transistor connected to the first divider node, a third divider node and a fourth divider node;
a fourth transistor connected to the second divider node, the third divider node and the data line; and
a fifth transistor connected to the fourth divider node, the reference voltage and a ground voltage.

5. The memory unit with the multiply-accumulate assist scheme for the multi-bit convolutional neural network based computing-in-memory applications of claim 4, wherein the voltage keeper comprises:
a first switch connected between the data line and a first keeper node;
a precharge switch connected between an input node and the first keeper node, wherein the multi-bit input voltage is applied to the input node;
a coupling switch connected between the input node and the first keeper node;
a second switch connected between the first keeper node and a second keeper node;
a coupling capacitor connected between the second keeper node and a third keeper node;
a first sample switch connected between the third keeper node and the output node;
a second sample switch connected between the second keeper node and the ground voltage; and
an output transistor connected to the output node, the third keeper node and the ground voltage.

6. The memory unit with the multiply-accumulate assist scheme for the multi-bit convolutional neural network based computing-in-memory applications of claim 5, wherein when the memory unit is operated during an initial time interval, the first switch, the second switch, the precharge switch, the coupling switch, the first sample switch and the second sample switch are turned off; and a voltage level of the third divider node is set to allow the third transistor and the fourth transistor to be operated in a saturation region.

7. The memory unit with the multiply-accumulate assist scheme for the multi-bit convolutional neural network based computing-in-memory applications of claim 6, wherein when the memory unit is operated during a first time interval, the first switch and the precharge switch are turned on to precharge a voltage level of the data line to the multi-bit input voltage;

the first sample switch and the second sample switch are turned on to store a threshold voltage of the output transistor at the coupling capacitor; and the second switch and the coupling switch are turned off;

wherein the first time interval follows the initial time interval.

8. The memory unit with the multiply-accumulate assist scheme for the multi-bit convolutional neural network based computing-in-memory applications of claim 7, wherein when the memory unit is operated during a second time interval, the first switch, the second switch and the first sample switch are turned on;

the precharge switch, the coupling switch and the second sample switch are turned off; and the voltage level of the data line is equal to a voltage level of the second keeper node, and the voltage level of the data line is determined by the charge current of the data line and the resistive element of the non-volatile memory cell;

wherein the second time interval follows the first time interval.

9. The memory unit with the multiply-accumulate assist scheme for the multi-bit convolutional neural network based computing-in-memory applications of claim 8, wherein when the memory unit is operated during a third time interval, the coupling switch and the second switch are turned on to change the voltage level of the second keeper node from the voltage level of the data line to the multi-bit input voltage, so that there is a voltage variation on each of the second keeper node and the third keeper node via the coupling capacitor;

the first switch, the precharge switch, the first sample switch and the second sample switch are turned off; and the output transistor is controlled by a voltage level of the third keeper node to generate the output current;

wherein the third time interval follows the second time interval.

10. The memory unit with the multiply-accumulate assist scheme for the multi-bit convolutional neural network based computing-in-memory applications of claim 9, wherein during the third time interval, when the multi-bit input voltage is smaller than the voltage level of the data line, the voltage level of the second keeper node is decreased according to the voltage variation, the voltage variation is decreased and coupled from the second keeper node to the third keeper node through the coupling capacitor, and the voltage variation is equal to the voltage level of the data line minus the multi-bit input voltage; and when the multi-bit input voltage is greater than the voltage level of the data line, the voltage level of the second keeper node is increased according to the voltage variation, the voltage variation is increased and coupled from the second keeper node to the third keeper node through the coupling capacitor, and the voltage variation is equal to the multi-bit input voltage minus the voltage level of the data line.

11. The memory unit with the multiply-accumulate assist scheme for the multi-bit convolutional neural network based computing-in-memory applications of claim 1, wherein the voltage divider comprises:

a first transistor connected to a power supply voltage and a first divider node;

a second transistor connected to the power supply voltage, the first divider node and a second divider node, wherein the second transistor has a first transistor width;

a third transistor connected to the first divider node and a third divider node;

a fourth transistor connected to the second divider node and the third divider node;

a fifth transistor connected to a fourth divider node, the reference voltage and a ground voltage;

a control divider transmission gate connected between the third transistor and the fifth transistor, wherein the control divider transmission gate is connected to the fifth transistor via the fourth divider node;

a first divider transmission gate connected between the fourth transistor and the data line;

a sixth transistor connected to the power supply voltage, the first divider node and a fifth divider node, wherein the sixth transistor has a second transistor width;

a seventh transistor connected to the fifth divider node and the third divider node;

a second divider transmission gate connected between the seventh transistor and the data line;

an eighth transistor connected to the power supply voltage, the first divider node and a sixth divider node, wherein the eighth transistor has a third transistor width;

a ninth transistor connected to the sixth divider node and the third divider node; and a third divider transmission gate connected between the ninth transistor and the data line;

wherein the first transistor width, the second transistor width and the third transistor width are equal to each other.

12. The memory unit with the multiply-accumulate assist scheme for the multi-bit convolutional neural network based computing-in-memory applications of claim 11, wherein the voltage keeper comprises two voltage sub-keepers, and each of the two voltage sub-keepers comprises:

a first switch connected between the data line and a first keeper node;

a precharge switch connected between an input node and the first keeper node, wherein the multi-bit input voltage is applied to the input node;

a coupling switch connected between the input node and the first keeper node;

a second switch connected between the first keeper node and a second keeper node;

a coupling capacitor connected between the second keeper node and a third keeper node;

a first sample switch connected between the third keeper node and the output node;

a second sample switch connected between the second keeper node and the ground voltage; and an output transistor connected to the output node, the third keeper node and the ground voltage;

wherein the output transistor of one of the two voltage sub-keepers has a first output transistor width, the output transistor of another of the two voltage sub-keepers has a second output transistor width, and the second output transistor width is equal to four times the first output transistor width.

13. The memory unit with the multiply-accumulate assist scheme for the multi-bit convolutional neural network based computing-in-memory applications of claim 1, wherein the voltage divider comprises:

a first transistor connected to a power supply voltage and a first divider node;

a second transistor connected to the power supply voltage, the first divider node and a second divider node, wherein the second transistor has a first transistor width;

a third transistor connected to the first divider node and a third divider node;

a fourth transistor connected to the second divider node and the third divider node;

a fifth transistor connected to a fourth divider node, the reference voltage and a ground voltage;

a control divider transmission gate connected between the third transistor and the fifth transistor, wherein the control divider transmission gate is connected to the fifth transistor via the fourth divider node;

a first divider transmission gate connected between the fourth transistor and the data line;

a sixth transistor connected to the power supply voltage, the first divider node and a fifth divider node, wherein the sixth transistor has a second transistor width;

a seventh transistor connected to the fifth divider node and the third divider node; and a second divider transmission gate connected between the seventh transistor and the data line;

wherein the second transistor width is equal to twice the first transistor width.

14. A computing method of the memory unit with the multiply-accumulate assist scheme for the multi-bit convolutional neural network based computing-in-memory applications of claim 1, comprising:

performing a voltage level applying step, wherein the voltage level applying step comprises applying a first voltage level to the reference voltage, applying a second voltage level to the word line, and applying a third voltage level to the multi-bit input voltage;

performing a computing step, wherein the computing step comprises driving the voltage divider to generate the charge current on the data line according to the reference voltage and generate the voltage level of the data line by the non-volatile memory cell and the charge current, and driving the voltage keeper to generate the output current on the output node according to the multi-bit input voltage and the voltage level of the data line.

15. The computing method of claim 14, wherein the voltage level applying step and the computing step are performed during an initial time interval, a first time interval, a second time interval and a third time interval; and during the initial time interval, a first switch, a second switch, a precharge switch, a coupling switch, a first sample switch and a second sample switch of the voltage keeper are turned off, and a voltage level of a third divider node of the voltage divider is set to allow a third transistor and a fourth transistor of the voltage divider to be operated in a saturation region.

16. The computing method of claim 15, wherein during the first time interval, the first switch and the precharge switch are turned on to precharge a voltage level of the data line to the multi-bit input voltage;

the first sample switch and the second sample switch are turned on to store a threshold voltage of the output transistor at a coupling capacitor; and the second switch and the coupling switch are turned off;

wherein the first time interval follows the initial time interval.

17. The computing method of claim 16, wherein during the second time interval, the first switch, the second switch and the first sample switch are turned on;

the precharge switch, the coupling switch and the second sample switch are turned off; and the voltage level of the data line is equal to a voltage level of a second keeper node, and the voltage level of the data line is determined by the charge current of the data line and the resistive element of the non-volatile memory cell;

wherein the second time interval follows the first time interval.

18. The computing method of claim 17, wherein during the third time interval, the coupling switch and the second switch are turned on to change the voltage level of the second keeper node from the voltage level of the data line to the multi-bit input voltage, so that there is a voltage variation on each of the second keeper node and a third keeper node via the coupling capacitor;

the first switch, the precharge switch, the first sample switch and the second sample switch are turned off; and the output transistor is controlled by a voltage level of the third keeper node to generate the output current;

wherein the third time interval follows the second time interval.

19. The computing method of claim 18, wherein during the third time interval, the multi-bit input voltage is smaller than the voltage level of the data line, the voltage level of the second keeper node is decreased according to the voltage variation, the voltage variation is decreased and coupled from the second keeper node to the third keeper node through the coupling capacitor, and the voltage variation is equal to the voltage level of the data line minus the multi-bit input voltage.

20. The computing method of claim 18, wherein during the third time interval, the multi-bit input voltage is greater than the voltage level of the data line, the voltage level of the second keeper node is increased according to the voltage variation, the voltage variation is increased and coupled from the second keeper node to the third keeper node through the coupling capacitor, and the voltage variation is equal to the multi-bit input voltage minus the voltage level of the data line.

* * * * *